Nov. 3, 1970 H. J. BRESEE ET AL 3,538,399

PN JUNCTION GATED FIELD EFFECT TRANSISTOR HAVING BURIED LAYER OF LOW RESISTIVITY

Filed May 15, 1968

HEBER J. BRESEE
GEORGE R. WILSON
*INVENTORS*

BY

*BUCKHORN, BLORE, KLARQUIST & SPARKMAN*
*ATTORNEYS*

United States Patent Office 3,538,399

Patented Nov. 3, 1970

3,538,399

PN JUNCTION GATED FIELD EFFECT TRANSISTOR HAVING BURIED LAYER OF LOW RESISTIVITY

Heber J. Bresee, Aloha, and George R. Wilson, Beaverton, Oreg., assignors to Tektronix, Inc., Beaverton, Oreg., a corporation of Oregon Filed May 15, 1968, Ser. No. 729,175
Int. Cl. H01l 11/14
U.S. Cl. 317—235 9 Claims

ABSTRACT OF THE DISCLOSURE

A PN junction gated field effect transistor is described employing a buried layer of lower resistivity semiconductor material selectively diffused beneath the bottom gate region of an epitaxial layer provided under the channel of such transistor. The buried layer prevents low current carrier concentration in the epitaxial layer of such gate from limiting the spread in thickness of the depletion region surrounding the PN junction between the channel and the bottom gate at high voltages. The resulting field effect transistor has higher output resistance and lower series gate resistance due to such buried layer. A monolithic integrated circuit including bipolar transistors and such field effect transistors may be provided with such a buried layer in both types of transistors.

BACKGROUND OF THE INVENTION

The subject matter of the present invention relates generally to field effect semiconductor devices and in particular to PN junction gated field effect transistors in which an intermediate layer of low resistivity semiconductor material is provided between a semiconductor substrate and the bottom gate region of an epitaxial layer which is located under the channel portion of such transistor. This intermediate or "buried" layer provides additional current carriers for the bottom gate and prevents the thickness of the depletion region of the PN junction between such bottom gate and the channel from being limited when such depletion region reaches the bottom of the epitaxial layer during high voltage operation.

The field effect transistor of the present invention is especially useful in monolithic integrated circuits including bipolar transistors, as well as such field effect transistors because the buried layer may be provided in both types of transistors. One such integrated circuit is shown in copending U.S. patent application Ser. No. 697,055, filed Jan. 18, 1968 by H. J. Bresee. The preferred embodiment of the field effect transistor of the present invention employs a top gate region and a bottom gate region on opposite sides of the channel. In addition the buried layer principle of the present invention can also be applied to a field effect transistor employing only a bottom gate region and no top gate, as shown in copending U.S. patent application Ser. No. 670,735, filed Sept. 26, 1967 by H. J. Bresee, now abandoned. This "topless" field effect transistor employs only a single PN junction to gate the channel, and in some cases it may not be possible to completely cut off the source to drain current flowing in the channel due to the limitation in spread of the bottom gate junction depletion region which would prevent such transistor from being used as a switch. However, the buried layer avoids this problem.

Buried layers have previously been employed in bipolar transistors but for an entirely different purpose than that for which they are used in the field effect transistors of the present invention. Thus, planar type bipolar transistors in which the contacts for the emitter, base and collector are all on the same surface of the transistor have a high saturation resistance in the collector region due to the increased length of the collector current path. A buried layer is provided beneath the collector to provide a low resistance in parallel with the bulk resistance of the collector region in order to lower such saturation resistance. However, the buried layer is not employed to solve the limiting of the spread of the PN junction depletion region, as is true in the field effect transistors of the present invention.

It is therefore one object of the present invention to provide a field effect semiconductor device employing a buried layer of low resistivity semiconductor material.

Another object of the present invention is to provide an improved PN junction gated field effect transistor having an intermediate layer of low resistivity semiconductor material provided beneath the bottom gate region of an epitaxial layer located under the channel region to provide such transistor with a higher output resistance and a lower series gate resistance.

A further object of the present invention is to provide a monolithic integrated circuit including field effect transistors and bipolar transistors in which a buried layer of low resistivity semiconductor material is provided in such transistors.

An additional object of the present invention is to provide an improved PN junction gated field effect transistor including a buried layer of low resistivity semiconductor material which provides additional current carriers in its bottom gate region in order to prevent limitation of the spreading in thickness of the space charge depletion region surrounding the bottom gate junction produced by increased reverse bias voltages.

BRIEF DESCRIPTION OF DRAWINGS

Other objects and advantages will be apparent from the following detailed description of a preferred embodiment thereof and from the attached drawings of which.

DETAILED DESCRIPTION OF PREFERRED EMBODIMENT

Figure 1:
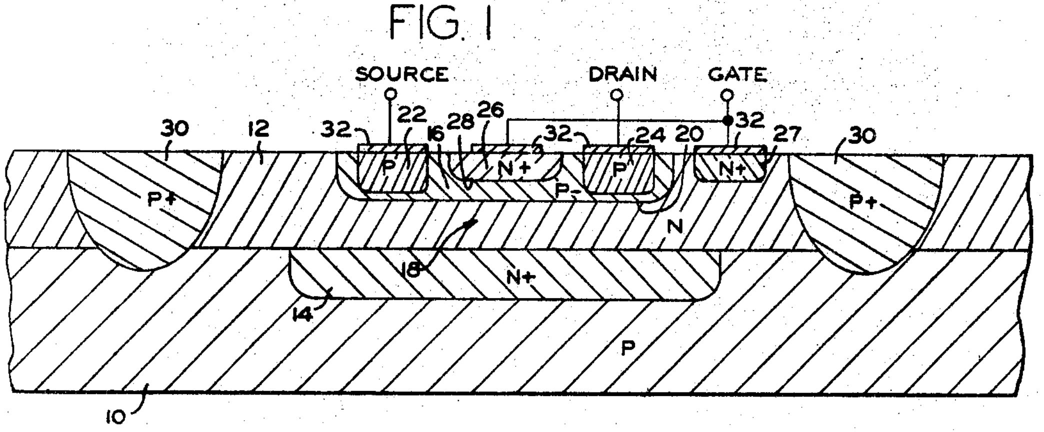
FIG. 1 is a vertical section view of a portion of an integrated circuit employing a field effect transistor in accordance with the present invention.

As shown in FIG. 1, one embodiment of the field effect transistor of the present invention is provided on a substrate member 10 of semiconductor material as part of a monolithic integrated circuit including a plurality of field effect transistors and a plurality of bipolar transistors (not shown) formed on such substrate member. One such integrated circuit is described in greater detail in the copending U.S. application Ser. No. 697,055 referred to above. The substrate member 10 may be P type silicon having a resistivity of 10 ohm-centimeters. A layer 12 of a substantially uniform resistivity formed of N type semiconductor material having a resistivity of 1 ohm-centimeter, is provided on the upper surface of the substrate member in any suitable manner such as by epitaxial growth with a doping impurity of phosphorous or other N type dopant. Beneath the epitaxial layer 12 is an intermediate layer 14 of N+ type semiconductor material having a lower resistivity than such epitaxial layer. Thus the intermediate layer 14 has a sheet resistance of about 20 ohms per square which is lower than the sheet resistance of such epitaxial layer which is about 2000 ohms per square for a thickness of 5 microns. This intermediate region, sometimes referred to as a "buried layer," may be formed by diffusing antimony doping material into the surface of the substrate member 10 before the epitaxial layer 12 is grown thereon.

A channel region 16 of P− type semiconductor material is formed by diffusing boron doping impurity into the epitaxial layer to provide a high sheet resistance of about 1000 to 4000 ohms per square. The channel region 16 is superimposed above the buried layer 14 and spaced from such buried layer by a bottom gate portion 18 of the epitaxial layer which forms a lower PN junction 20 with such channel region. Two ohmic contacts of P type material, including a source 22 and a drain 24, are formed at the opposite ends of the P− type channel by diffusion of boron into the channel to provide such contacts with a sheet resistance of about 200 ohms per square. A top gate region 26 of N+ type semiconductor material is formed between the source and drain by diffusing phosphorous into the channel 16 to provide such top gate with a sheet resistance of about 8 to 10 ohms per square. At the same time a bottom gate contact 27 of N+ type semiconductor material is formed in the epitaxial layer 12 to provide an ohmic contact for the bottom gate region 18. The top gate region 26 forms an upper PN junction 28 with the channel 16. Thus the field effect transistor of FIG. 1 includes both a top gate junction 28 and a bottom gate junction 20 on opposite sides of the channel to provide the field effect operation. However it may be desirable to eliminate the top gate region 26 in order to enable the source 22 to be positioned closer to the drain 24 for higher frequency response, as shown in copending U.S. application 670,735 referred to above. In such a "topless" field effect transistor, the buried layer 14 becomes even more important because only the bottom gate junction 20 is present to provide the field effect operation.

An isolation grid pattern 30 of P+ type semiconductor material having a sheet resistance of 7 to 8 ohms per square is formed by diffusing boron completely through the epitaxial layer 12 into the substrate member 10 in order to provide the field effect transistors and bipolar transistors on separate isolated regions of the epitaxial layer. Thus the PN junctions formed by the substrate member 10 and the isolation grid 30 with the epitaxial layer electrically isolates the transistors from one another. A plurality of metal contacts 32 of aluminum are provided on the source 22, drain 24, top gate 26, and the bottom gate contact 27 so that such contacts are coplanar with each other. The remaining surface of the epitaxial layer 12 is coated with an insulating layer (not shown) such as silicon oxide material, in a conventional manner. This oxide layer may be employed as the diffusion mask by conventional photo-resist masking and etching techniques as described in the above-mentioned application 697,055.

Since the bottom gate region 18 has a thickness of about one half that of the epitaxial layer 12, its sheet resistance is about 4000 ohms per square. As stated previously, the buried layer 14 has a sheet resistance of about 20 ohms per square. Thus it can be seen that the buried layer 14 is provided with an extremely low sheet resistance which is approximately one 200th of the sheet resistance of the bottom gate region 18. This resistivity is due to a much greater concentration of current carriers in the buried layer 14 in the bottom gate region, which is important for the reasons hereafter described with respect to FIGS. 2 and 3.

Figure 2:
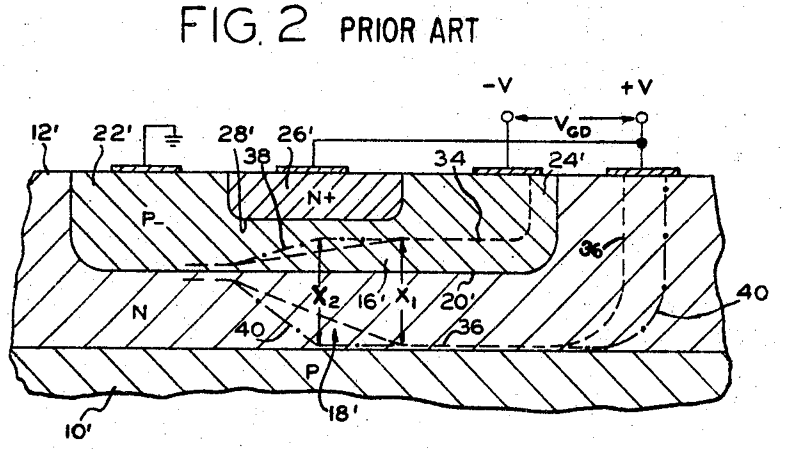
FIG. 2 PRIOR ART
FIG. 2 is a partially schematic diagram of a vertical section view of a prior art field effect transistor not employing the buried layer of the present invention and showing the spread of the depletion region surrounding the bottom gate junction.

As shown in FIG. 2, previous field effect transistors not employing the buried layer of the present invention may have a relatively low output resistance due to the substrate 10' limiting the spread in thickness of the depletion region surrounding the PN junction 20' forming the bottom gate of such transistor. Similar reference numerals have been employed in FIG. 2 to that employed in FIG. 1 to designate like parts. in addition, for purposes of clarity only the depletion region of the bottom gate junction 20' is shown, since the top gate junction 28' is not subject to the depletion spread limitation problem due to the fact that the top gate region 26' is of a low resistance N+ type semiconductor material. The boundaries 34 and 36 of the depletion region of the bottom gate junction 20', for a low reverse bias voltage $V_{GD}$ applied between the gate 18' and the drain 24', are shown by dashed lines. Thus the maximum thickness of the depletion region having boundaries 34 and 36 is a value $X_1$ when the lower boundary 36 reaches the substrate 10'. A further increase of the reverse bias voltage $V_{GD}$ changes the shape of the depletion region to that within the dash-dot boundary lines 38 and 40. However the maximum thickness $X_2$ of such high voltage depletion region is the same as the thickness $X_1$ of the low voltage depletion region because the lower boundary 40 cannot expand to pass the substrate 10' and the upper boundary 38' is also limited correspondingly.

This limitation in the spread of the thickness of the depletion region in FIG. 2 is due to the fact that the bottom gate region 18' of the epitaxial layer becomes rapidly depleted of current carriers due to its low concentration of doping impurity. When all current carriers are depleted from the bottom gate portion 18', the lower boundary 40 of the depletion region reaches the substrate 10' and stops spreading. As a result the thickness of such depletion region no longer increases with reverse bias voltage. It should be noted that the total charge in the depletion region must be the same on both sides of the junction 20' so that the spread of the upper boundary 38 also stops when the lower boundary 40 reaches the substrate. This means that any further field effect action at higher reverse bias voltages is only achieved by the top gate junction 28'. As a result the output resistance of the field effect transistor is lowered considerably by this limitation in spread of the depletion region adjacent the bottom gate junction 20'. In addition, for "topless" field effect transistors of the type shown in copending application 670,735, this effect illustrated in FIG. 2 may prevent such transistor from ever turning completely off, and source to drain current will always flow, since the upper boundary 38 of the depletion region cannot spread to the top of the channel.

Figure 3:
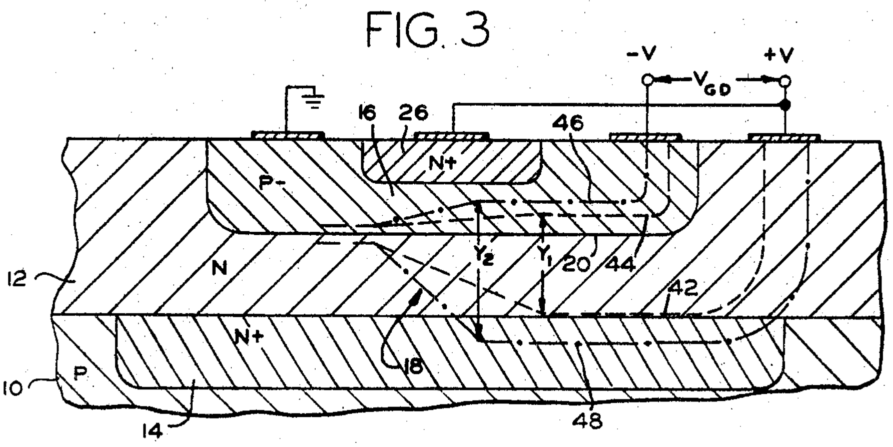
FIG. 3 is a partially schematic diagram similar to FIG. 2 showing the spread of the depletion region in the transistor of FIG. 1.

As shown in FIG. 3, the low resistance buried layer 14 employed in the field effect transistor of the present invention solves this problem. The buried layer 14 beneath the bottom gate portion 18 of the epitaxial layer has a greater concentration of doping impurities and provides additional current carriers for enlarging the depletion region. As a result the depletion region surrounding the PN junction 20 may spread beyond the bottom of the epitaxial layer into the buried layer region 14 of the substrate member. Thus as shown in FIG. 3 a depletion region having boundaries 42 and 44 on opposite sides of the PN junction 20 is formed with a maximum thickness $Y_1$ when the reverse bias voltage $V_{GD}$ between the gate and drain is increased sufficiently to cause the lower boundary 42 to reach the bottom of the epitaxial layer 12. Further increases in reverse bias voltage $V_{GD}$ cause the depletion region to spread to a region of greater maximum thickness $Y_2$ having boundaries 46 and 48. This is possible because the lower boundary 48 of such depletion region extends into the buried layer 14.

From the above it can be seen that the field effect action of the bottom gate junction 20 continues after its depletion region reaches the bottom of the epitaxial layer 12, unlike the previous field effect transistors such as shown in FIG. 2. This provides the field effect transistor of the present invention with a higher output resistance and a lower series gate resistance. Also in the case of the "topless" field effect transistor it enables cut off of the current flow between the source and drain, since the upper boundary 46 of the depletion region can reach the top of the channel portion so that such depletion region extends entirely across such channel.

It will be obvious to those having ordinary skill in the art that many changes may be made in the above described preferred embodiments of the present invention without departing from the spirit of the invention. Therefore the scope of the present invention should only be determined by the following claims.

We claim:

1. A PN junction gated field effect device, comprising:

a substrate member of semiconductor material of one type of conductivity;

a substantially uniform resistivity layer of semiconductor material of opposite type of conductivity provided on said substrate member and including a bottom gate portion;

a channel region of said one type of conductivity provided in said uniform resistivity layer over the bottom gate portion of said layer and forming a PN junction gate therewith;

a pair of spaced source and drain contacts provided on said channel region;

said bottom gate portion having a sufficiently high resistivity and low thickness that it tends to become completely depleted of current carriers and to thereby limit further increases in thickness of the depletion region at the bottom gate to channel junction at normal operating voltages of said device;

isolation regions of said one conductivity extending completely through said uniform resistivity layer and into the substrate, said isolation regions forming PN junctions with the uniform resistivity layer and being of a lower resistivity than said substrate; and an intermediate region of semiconductor material of said opposite conductivity provided under the channel region in only a portion of the surface of said substrate member beneath the bottom gate portion of said uniform resistance layer to form a common junction with said bottom gate portion, said intermediate region being spaced from said isolation regions to prevent the formation of PN junctions between said intermediate region and said isolation regions, and said intermediate region having the same type of conductivity as said bottom gate portion but being of a lower resistivity to prevent said limiting of the thickness of the bottom gate to channel depletion region due to the presence of a greater concentration of doping impurity in said intermediate region.

2. A device in accordance with claim 1 which forms a field effect transistor and in which said uniform resistivity layer is an epitaxial layer and the intermediate region is diffused into the substrate member to provide a buried layer beneath said epitaxial layer.

3. A transistor in accordance with claim 2 which also includes a top gate region of semiconductor material of said opposite type of conductivity provided in said epitaxial layer over said channel region and forming another PN junction gate with said channel region, and a gate contact provided on said top gate region between said source and drain.

4. A transistor in accordance with claim 3 in which the bottom gate region is less than 5 microns thick and has a sheet resistance of at least one hundred times that of said intermediate region.

5. A device in accordance with claim 1 in which the source, drain and gate contacts are substantially coplanar with each other.

6. A device in accordance with claim 1 in which the channel region is high resistivity semiconductor material and the source and drain contacts include ohmic contact regions of lower resistivity semiconductor material.

7. A transistor in accordance with claim 2 in which the substrate member is of silicon and the intermediate region is a different region containing antimony doping impurity.

8. A transistor in accordance with claim 7 in which the uniform resistivity layer is an epitaxial layer with phosphorous doping impurity on the substrate member over the intermediate region to provide said region as a buried layer.

9. Apparatus including a plurality of field effect transistors in accordance with claim 1 formed on said substrate member and separated by the isolation regions to provide a monolithic integrated circuit.

References Cited

UNITED STATES PATENTS

| | | | |
|---|---|---|---|
| 3,150,299 | 9/1964 | Noyce | 317—235 |
| 3,404,295 | 10/1968 | Warner | 307—302 |
| 3,210,677 | 10/1965 | Lin et al. | 317—235 X |
| 3,236,701 | 2/1966 | Lin | 317—235 X |
| 3,237,062 | 2/1966 | Murphy | 317—234 |
| 3,260,902 | 7/1966 | Porter | 317—235 |
| 3,278,853 | 11/1963 | Lin | 317—235 X |
| 3,327,182 | 6/1967 | Kisinko | 317—235 |
| 3,370,995 | 2/1968 | Lowery et al. | 317—235 X |
| 3,404,450 | 10/1968 | Karcher | 317—235 X |
| 3,414,782 | 12/1968 | Lin et al. | 317—235 |

JERRY D. CRAIG, Primary Examiner